(12) United States Patent
Yang et al.

(10) Patent No.: US 9,395,729 B1
(45) Date of Patent: Jul. 19, 2016

(54) CIRCUIT DRIVING METHOD AND DEVICE

(71) Applicant: Macronix International Co., Ltd., Hsinchu (TW)

(72) Inventors: Shang-Chi Yang, Xihu Township (TW); Yi-Huang Liu, Dayuan Township (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/722,192

(22) Filed: May 27, 2015

Related U.S. Application Data

(60) Provisional application No. 62/103,301, filed on Jan. 14, 2015.

(51) Int. Cl.
*G11C 7/04* (2006.01)
*G05F 1/46* (2006.01)
*G05F 1/56* (2006.01)
*G11C 5/14* (2006.01)

(52) U.S. Cl.
CPC *G05F 1/463* (2013.01); *G05F 1/56* (2013.01); *G11C 5/147* (2013.01)

(58) Field of Classification Search
USPC .......... 365/211, 229, 226, 227; 323/273, 280, 323/279
See application file for complete search history.

(56) References Cited

U.S. PATENT DOCUMENTS

| | | | | |
|---|---|---|---|---|
| 4,008,418 A | * | 2/1977 | Murphy | G05F 1/571 323/226 |
| 6,310,467 B1 | * | 10/2001 | Sauer | G05F 1/575 323/273 |
| 2006/0261797 A1 | * | 11/2006 | Man | G05F 1/575 323/314 |

* cited by examiner

*Primary Examiner* — Vu Le
(74) *Attorney, Agent, or Firm* — Finnegan, Henderson, Farabow, Garrett & Dunner LLP

(57) ABSTRACT

A low dropout regulator includes a pre-regulation circuit, a sustaining circuit coupled to the pre-regulation circuit, and a pass element coupled to the sustaining circuit. The pre-regulation circuit is configured to generate a bias voltage. The sustaining circuit is configured to receive the bias voltage and an enable signal, and generate a control signal. The sustaining circuit is turned on or off by the enable signal. The pass element is configured to receive the control signal. When the enable signal turns on the sustaining circuit, the sustaining circuit generates the control signal according to the bias voltage so that a voltage value of the control signal is higher than a voltage threshold of the pass element. When the enable signal turns off the sustaining circuit, the sustaining circuit maintains the voltage value of the control signal above the voltage threshold of the pass element.

20 Claims, 4 Drawing Sheets

CIRCUIT DRIVING METHOD AND DEVICE

CROSS-REFERENCE TO RELATED APPLICATIONS

This application is based upon and claims the benefit of priority from Provisional Application No. 62/103,301, filed on Jan. 14, 2015, the entire contents of which are incorporated herein by reference.

TECHNOLOGY FIELD

The disclosure relates to circuit driving method and device and, more particularly, to a method and device for enabling/disabling a low dropout (LDO) regulator.

BACKGROUND

Low dropout (LDO) regulators are linear voltage regulators used to regulate an output voltage based on a supply voltage. For example, a memory chip may have a pump and a memory circuit including an LDO regulator. With an LDO regulator, the output voltage can be kept close to the supply voltage since the voltage drop across the regulator is small. However, since an LDO regulator needs to dissipate power across the regulator itself, power consumption may be a concern in designing or driving an LDO regulator.

Conventionally, the LDO regulator in the chip is always enabled when the chip is in a standby mode. FIG. 1 schematically shows waveforms, in a conventional technology, of a chip-select signal (CS#) applied to a memory circuit and an LDO enable signal (ENLDO) applied to an LDO regulator in the memory circuit. As shown in FIG. 1, when CS# goes high, ENLDO also goes high and thus the LDO is always enabled during the period in which the memory circuit is in the standby mode. Such a scheme may cause unnecessary power consumption by the LDO regulator.

SUMMARY

In accordance with the disclosure, there is provided a low dropout regulator. The low dropout regulator includes a pre-regulation circuit, a sustaining circuit coupled to the pre-regulation circuit, and a pass element coupled to the sustaining circuit. The pre-regulation circuit is configured to generate a bias voltage. The sustaining circuit is configured to receive the bias voltage and an enable signal, and generate a control signal. The sustaining circuit is turned on or off by the enable signal. The pass element is configured to receive the control signal. When the enable signal turns on the sustaining circuit, the sustaining circuit generates the control signal according to the bias voltage so that a voltage value of the control signal is higher than a voltage threshold of the pass element. When the enable signal turns off the sustaining circuit, the sustaining circuit maintains the voltage value of the control signal above the voltage threshold of the pass element.

Also in accordance with the disclosure, there is provided a regulation device including a low dropout (LDO) regulator and a signal generation circuit coupled to each other. The low dropout regulator includes a pre-regulation circuit, a sustaining circuit coupled to the pre-regulation circuit, and a pass element coupled to the sustaining circuit. The pre-regulation circuit is configured to receive an LDO enable signal and generate a bias voltage. The sustaining circuit is configured to receive the bias voltage and a sustaining-circuit enable signal, and generate a control signal. The sustaining circuit is turned on or off by the sustaining-circuit enable signal. The pass element is configured to receive the control signal. When the sustaining-circuit enable signal turns on the sustaining circuit, the sustaining circuit generates the control signal according to the bias voltage so that a voltage value of the control signal is higher than a voltage threshold of the pass element. When the sustaining-circuit enable signal turns off the sustaining circuit, the sustaining-circuit maintains the voltage value of the control signal above the voltage threshold of the pass element. The signal generation circuit is configured to generate a first periodic signal as the LDO enable signal and a second periodic signal as the sustaining-circuit enable signal.

Also in accordance with the disclosure, there is provided a method for driving a low dropout regulator in a memory circuit. The method includes applying a selection signal to the memory circuit to put the memory circuit in a standby mode during a standby time, detecting a temperature of the memory circuit, and generating an enable signal according to the temperature. A period of the enable signal is determined by the temperature and shorter than the standby time. The method further includes applying the enable signal to the low dropout regulator to periodically enable the low dropout regulator.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include method and device for enabling/disabling a low dropout (LDO) regulator.

Hereinafter, embodiments consistent with the disclosure will be described with reference to the drawings. Wherever possible, the same reference numbers will be used throughout the drawings to refer to the same or like parts.

Figure 1:
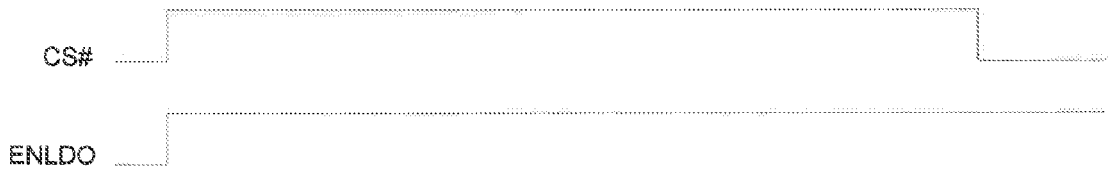
FIG. 1 schematically shows waveforms of a chip-select signal and a low dropout (LDO) enable signal according to a conventional technology.
Figure 2:
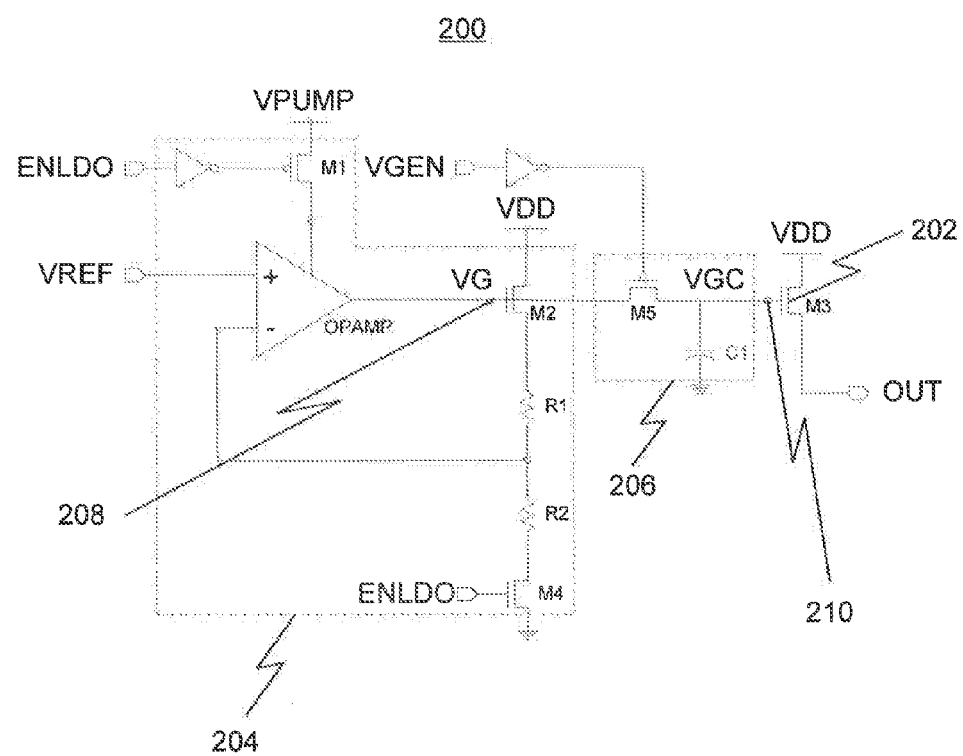
FIG. 2 is a circuit diagram of an LDO regulator according to an exemplary embodiment.

FIG. 2 is a circuit diagram of an exemplary LDO regulator 200 consistent with embodiments of the present disclosure. The LDO regulator 200 can be used to provide a regulated output voltage to a memory circuit, such as a NOR flash memory, a NAND flash memory, a dynamic random-access memory (DRAM), or a static random-access memory (SRAM).

The LDO regulator 200 includes a pass element 202, i.e., the N-channel field-effect transistor (FET) M3 in FIG. 2, which generates an output voltage OUT, based on a circuit supply voltage VDD. The FET M3 has a large size to provide a high driving capability. The LDO regulator 200 further includes a pre-regulator 204 (also referred to herein as a "pre-regulation circuit") and a sustaining circuit 206, which together provide a control signal VGC to a control terminal of the pass element 202, i.e., a gate electrode of the FET M3. The pre-regulator 204 includes an operational amplifier OPAMP, an FET M2, and resistors R1 and R2. The sustaining circuit 206 includes an FET M5 and a capacitor C1.

According to the present disclosure, the operational amplifier OPAMP may need a relatively high power supply voltage to function properly, but the circuit supply voltage VDD may not be high enough to meet the need of the operational amplifier OPAMP. Therefore, a pump circuit (described below) can be employed to generate a pump voltage VPUMP that is higher than the circuit supply voltage VDD, which is then supplied to a power supply terminal of the operational amplifier OPAMP through an FET M1. The non-inverting input terminal of the operational amplifier OPAMP receives a bandgap reference voltage VREF, which is substantially independent of temperature and has a non-zero voltage value. The inverting input terminal of the operational amplifier OPAMP is coupled to a mid-point node between the resistors R1 and R2, which are connected in series. The series connected resistors R1 and R2 are coupled to the circuit supply voltage VDD through the FET M2 and to a reference voltage, e.g., ground, through an FET M4. The operational amplifier OPAMP outputs a bias voltage VG at its output terminal. The OPAMP output terminal is coupled provide the bias voltage VG to a gate electrode of the FET M2 and a source/drain electrode of the FET M5. An LDO enable signal ENLDO is coupled to gate electrodes of the FETs M1 and M4, which serve as enable terminals of the pre-regulator 204, to turn on/off the FETs M1 and M4, and thus to turn on/off the pre-regulator 204.

In the LDO regulator 200 shown in FIG. 2, the FETs M1 and M5 are P-channel FETs, and the FETs M2, M3, and M4 are N-channel FETs. In some embodiments, N-channel FETs can be used as the FETs M1 and M5. In this scenario, the inverters connected to the gate electrodes of the FETs M1 and M5 may be omitted. Similarly, P-channel FETs can also be used as the FETs M2, M3, and M4. In this scenario, an inverter may be added to couple to the gate electrode of each of the FETs M2, M3, and M4. In the present disclosure, a source electrode or a drain electrode of an FET is generally referred to as a source/drain electrode.

As shown in FIG. 2, in the sustaining circuit 206, the capacitor C1 is coupled between the FET M5 and ground. A gate enable signal VGEN is coupled to a gate electrode, i.e., an enable terminal, of the FET M5 through an inverter to turn on/off the FET M5, and thus to turn on/off the sustaining circuit 206. The source/drain electrode of the FET M5 serves as an input terminal of the sustaining circuit 206 that receives the bias voltage VG.

The pre-regulator 204 generates the bias voltage VG at a node 208. When the FET M5 is turned on by the gate enable signal VGEN, i.e., when the FET M5 becomes conductive, the FET M5 passes the bias voltage VG to the gate electrode of the FET M3. As a result, a voltage at a node 210 is about the same as a voltage at the node 208. That is, when the FET M5 is turned on, a voltage value of the control signal VGC is about the same as the voltage value of the bias voltage VG. According to the present disclosure, when the FET M5 is turned on, the voltage value of the control signal VGC may be slightly higher or lower than the voltage value of the bias voltage VG, but in an ideal situation, the voltage value of the control signal VGC is the same as the voltage value of the bias voltage VG.

When the FET M5 turns off, due to the existence of the capacitor C1, charge at the node 210 does not dissipate immediately, and therefore the voltage value of the control signal VGC does not immediately drop to zero. That is, when the FET M5 turns off, the voltage value of the control signal VGC can stay at a certain level for a period of time, during which it may slowly decrease. So long as the voltage value of the control signal VGC is maintained higher than a threshold value of the FET M3, M3 remains in an on state and continues to generate the output voltage OUT.

Therefore, due to the presence of the sustaining circuit 206, the FET M3 can be kept on during an entire standby mode of the memory circuit regulated by the LDO regulator 200, without the pre-regulator 204 being kept on all the time. The pre-regulator 204 and the sustaining circuit 206 only need to be turned on periodically to recharge, i.e., refresh, the node 210, so that the voltage value of the control signal VGC is maintained higher than the threshold value of the FET M3. Since the operational amplifier OPAMP and the resistors R1 and R2 are major components consuming power, reducing the length of time that the pre-regulator 204 is kept on can reduce the power consumed by the pre-regulator 204, and hence reduce the power consumed by the LDO regulator 200.

When the FET M5 is turned off, the voltage value of the control signal VGC gradually decreases as the charge at the node 210 dissipates. The dissipating speed of the charge at the node 210 depends on the temperature, i.e., the charge at the node 210 dissipates faster at a higher temperature. Therefore, at a higher temperature, the node 210 needs to be recharged more frequently, which means that the pre-regulator 204 and the sustaining circuit 206 need to be turned on more frequently.

Figure 3:
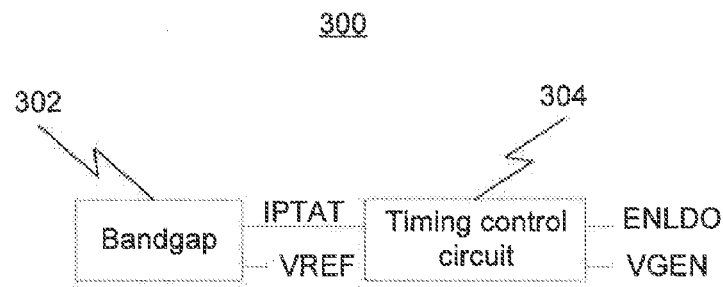
FIG. 3 is a block diagram schematically showing a signal generation circuit according to an exemplary embodiment.

To periodically turn on the pre-regulator 204 and the sustaining circuit 206, a periodic LDO enable signal ENLDO and a periodic gate enable signal VGEN need to be generated. FIG. 3 is a block diagram schematically showing an exemplary signal generation circuit 300 consistent with embodiments of the present disclosure. The signal generation circuit 300 is configured to generate the LDO enable signal ENLDO, the gate enable signal VGEN, and the bandgap reference voltage VREF.

As shown in FIG. 3, the signal generation circuit 300 includes a bandgap reference generator 302 and a timing control circuit 304. The bandgap reference generator 302 is configured to generate temperature-dependent currents and to generate the bandgap reference voltage VREF using the temperature-dependent currents. For example, one of the temperature-dependent currents may be positively correlated to temperature, such as a current that is proportional to the absolute temperature. Another one of the temperature-dependent currents may be negatively correlated to temperature, such as a current that is complementary to the absolute temperature. As a result, the temperature-dependent effects of these currents substantially cancel, causing the bandgap reference voltage VREF to be substantially independent of temperature.

Figure 4:
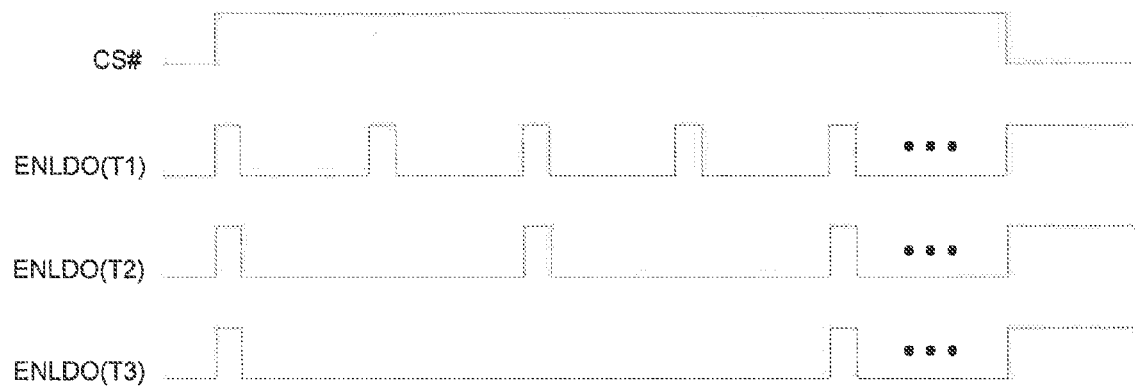
FIG. 4 schematically shows waveforms of an LDO enable signal at different temperatures according to an exemplary embodiment.

The positively correlated one of the temperature-dependent currents generated by the bandgap reference generator 302 (hereinafter referred to as the "current IPTAT") is input to the timing control circuit 304, which is configured to generate the periodic LDO enable signal ENLDO and the periodic gate enable signal VGEN based on the current IPTAT. Since the current IPTAT depends on the temperature, frequencies of the LDO enable signal ENLDO and the gate enable signal VGEN also depend on the temperature. According to the present disclosure, the timing control circuit 304 is configured such that the frequencies of the LDO enable signal ENLDO and the gate enable signal VGEN are both positively correlated to the temperature. That is, the frequencies of the LDO enable signal ENLDO and the gate enable signal VGEN increase when the temperature increases, and thus the node 210 is more frequently recharged. For example, FIG. 4 schematically shows the waveform of the LDO enable signal ENLDO at different temperatures T1, T2, and T3, when the memory circuit is put into the standby mode by the chip select signal CS#. In the example shown in FIG. 4, T1>T2>T3. As shown in FIG. 4, the LDO enable signal ENLDO has a higher frequency at a higher temperature.

Figure 5:
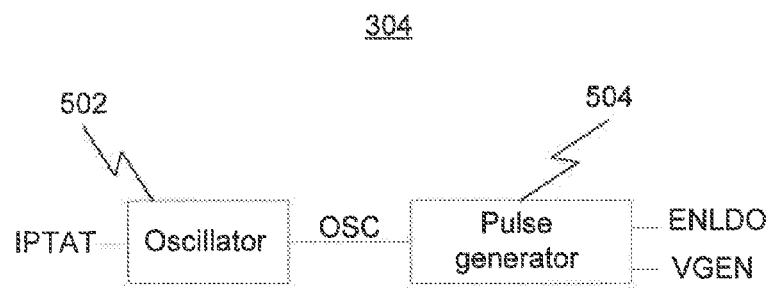
FIG. 5 is a block diagram schematically showing a timing control circuit according to an exemplary embodiment.

FIG. 5 is a block diagram schematically showing an example of the timing control circuit 304 consistent with embodiments of the present disclosure. As shown in FIG. 5, the timing control circuit 304 includes an oscillator 502 and a pulse generator 504. The oscillator 502 is configured to generate an oscillation signal OSC that has a frequency positively correlated to the current IPTAT. That is, the frequency of the oscillation signal OSC increases when the current IPTAT increases, and hence increases when the temperature increases. The oscillator 502 may be implemented using any type of oscillator that is suitable for the purpose of generating the oscillation signal OSC based on the current IPTAT, such as an oscillator including several, for example three, inverters connected in series.

The pulse generator 504 is configured to truncate each pulse of the oscillation signal OSC, and generate the LDO enable signal ENLDO and the gate enable signal VGEN that have a shorter pulse in each period than the oscillation signal OSC. Frequencies of the LDO enable signal ENLDO and the gate enable signal VGEN are the same as each other, and are the same as the frequency of the oscillation signal OSC.

In some embodiments, the pulse generator 504 is configured to generate a gate enable signal VGEN in which each pulse rises later than the corresponding pulse of the LDO enable signal ENLDO. Such a scheme ensures that the voltage value of the bias voltage VG is passed to the node 210 after the bias voltage VG has stabilized. Further, the pulse generator 504 is configured to generate a gate enable signal VGEN in which each pulse falls at about the same time as the corresponding pulse of the LDO enable signal ENLDO. This ensures that the pre-regulator 204 and the sustaining circuit 206 are turned off at about the same time, such that the node 210 does not immediately lose the charge after the pre-regulator 204 is turned off.

In some embodiments, a different mechanism may be employed to generate the LDO enable signal ENLDO and the gate enable signal VGEN, as long as the frequencies of the LDO enable signal ENLDO and the gate enable signal VGEN are about the same as each other and are positively correlated to temperature, positions of corresponding pulses of the LDO enable signal ENLDO and the gate enable signal VGEN in a same period are about the same, and each pulse of the LDO enable signal ENLDO rises earlier than a corresponding pulse of the gate enable signal VGEN in a same period. For example, the LDO enable signal ENLDO and the gate enable signal VGEN may be generated using two different signal generators.

Figure 6:
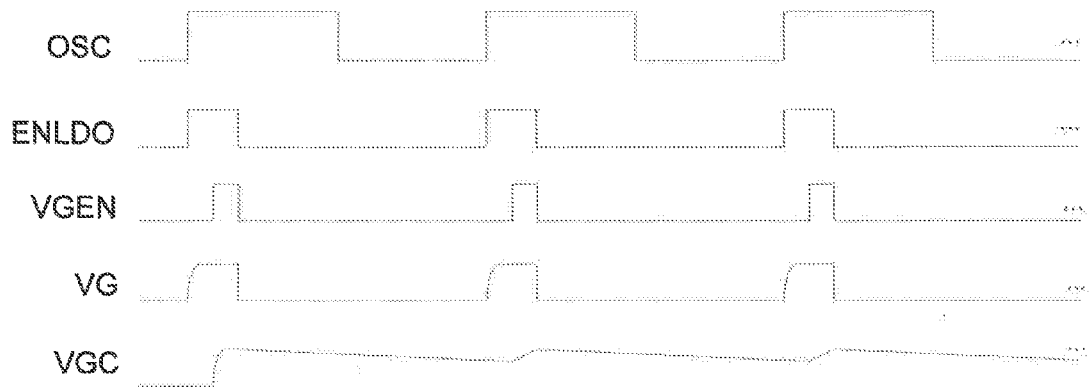
FIG. 6 schematically shows waveforms of various signals according to an exemplary embodiment.

Referring again to FIG. 2, the LDO enable signal ENLDO and the gate enable signal VGEN generated by the signal generation circuit 300 are coupled to the gate electrodes of the FETs M1, M4, and M5, to control the on and off states of the pre-regulator 204 and the sustaining circuit 206. FIG. 6 schematically shows waveforms of signals OSC, ENLDO, VGEN, VG, and VGC. As shown in FIG. 6, in each period, when the LDO enable signal ENLDO rises, the bias voltage VG starts to gradually increase until it reaches a certain value. Thereafter, the gate enable signal VGEN rises so that the control signal VGC gradually increases. When the LDO enable signal ENLDO and the gate enable signal VGEN fall, the bias voltage VG drops immediately but the control signal VGC decreases gradually at a much slower rate. Before the control signal VGC drops below the threshold value of the FET M3, the LDO enable signal ENLDO and the gate enable signal VGEN rise again to recharge the node 210, and thus control signal VGC increases again.

Figure 7:
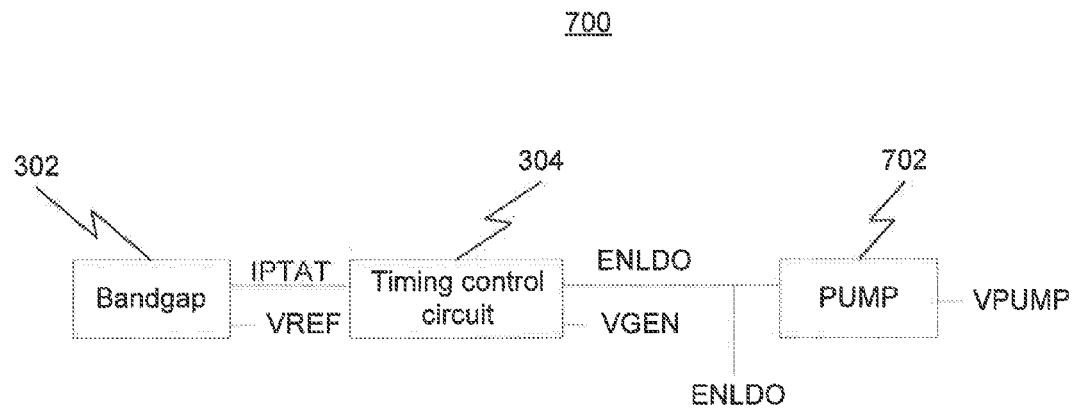
FIG. 7 is a block diagram schematically showing a signal generation circuit according to another exemplary embodiment.

FIG. 7 is a block diagram schematically showing another exemplary signal generation circuit 700 consistent with embodiments of the present disclosure. The signal generation circuit 700 is similar to the signal generation circuit 300, except that the signal generation circuit 700 further includes a pump circuit 702. The pump circuit 702 is configured to generate the pump voltage VPUMP that is higher than the circuit supply voltage VDD.

Consistent with embodiments of the present disclosure, the LDO regulator 200 together with the signal generation circuit 300 or the signal generation circuit 700 form a regulation device that provides a regulated voltage, e.g., the output voltage OUT shown in FIG. 2, to supply to a memory circuit.

Figure 8:
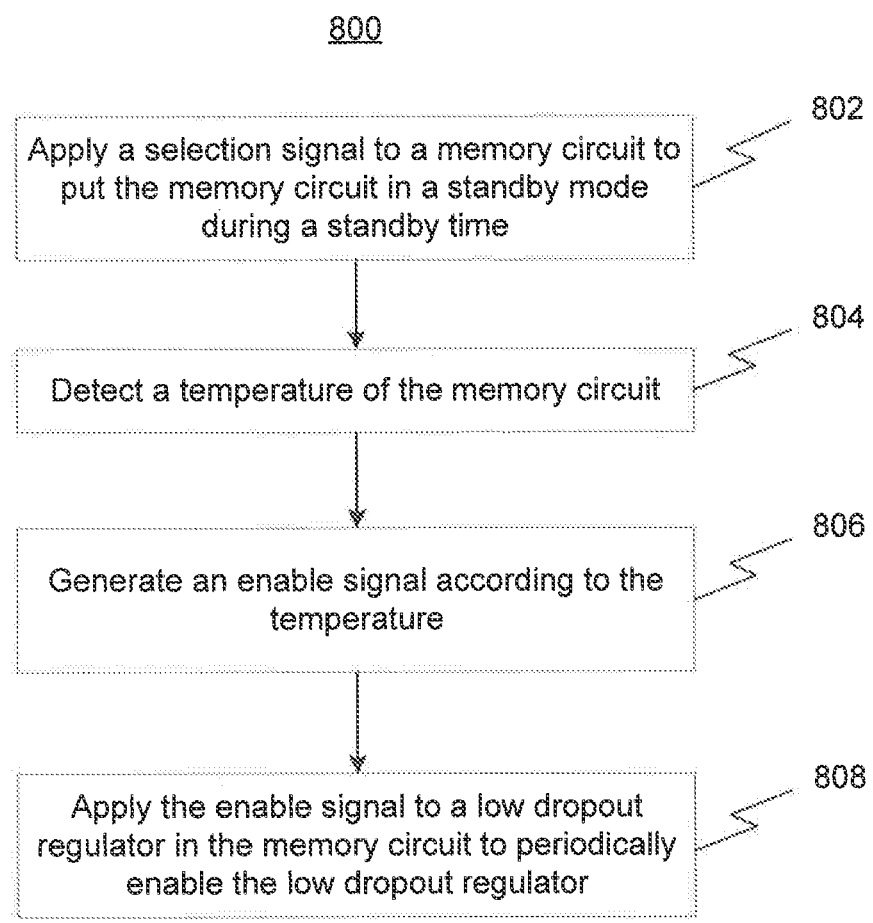
FIG. 8 is a flow chart showing a method for driving an LDO regulator in a memory circuit according to an exemplary embodiment.

FIG. 8 is a flow chart showing an exemplary method 800 consistent with embodiments of the present disclosure for driving an LDO regulator in a memory circuit. As shown in FIG. 8, at 802, a selection signal, such as the chip-select signal CS# described above, is applied to the memory circuit to put the memory circuit in a standby mode during a standby time. At 804, a temperature of the memory circuit is detected. The temperature of the memory circuit can be detected by, for example, the bandgap reference generator 302 described above. At 806, an enable signal, such as at least one of the LDO enable signal ENLDO or the gate enable signal VGEN described above, is generated according to the temperature. The enable signal can be generated, for example, by the signal generation circuit 300 or the signal generation circuit 700 described above, and has a period that is determined by the temperature and that is shorter than the standby time. In some embodiments, the period of the enable signal is negatively correlated to the temperature, i.e., the period decreases when the temperature increases. At 808, the enable signal is applied to the LDO regulator to periodically enable the LDO regulator, such that the LDO regulator is periodically turned on.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A low dropout (LDO) regulator, comprising:
a pre-regulation circuit configured to generate a bias voltage;
a sustaining circuit coupled to the pre-regulation circuit, the sustaining circuit being configured to receive the bias voltage and an enable signal, and generate a control signal, the sustaining circuit being turned on or off by the enable signal; and
a pass element coupled to the sustaining circuit, the pass element being configured to receive the control signal,
wherein the sustaining circuit is further configured to:
generate, when the enable signal turns on the sustaining circuit, the control signal according to the bias voltage so that a voltage value of the control signal is higher than a voltage threshold of the pass element, and
maintain, when the enable signal turns off the sustaining circuit, the voltage value of the control signal above the voltage threshold of the pass element.

2. The LDO regulator of claim 1, wherein the sustaining circuit includes:
a field-effect transistor (FET) having a first source/drain electrode, a second source/drain electrode, and a gate electrode, the first source/drain electrode being configured to receive the bias voltage, the second source/drain electrode being coupled the pass element, and the gate electrode being configured to receive the enable signal; and
a capacitor coupled between the second source/drain electrode and ground.

3. The LDO regulator of claim 1, wherein the pre-regulation circuit includes:
a field-effect transistor (FET) having a gate electrode and two source/drain electrodes;
an operational amplifier having two input terminals and an output terminal, the output terminal of the operational amplifier being coupled to the gate electrode of the FET; and
a pair of resistors coupled to one of the source/drain electrodes of the FET, the pair of resistors being coupled in series and a mid-point node between the pair of resistors being coupled to one of the input terminals of the operational amplifier.

4. The LDO regulator of claim 3, wherein:
the input terminals of the operational amplifier include an inverting terminal and a non-inverting terminal,
the mid-point node is coupled to the inverting terminal, and
the non-inverting terminal is configured to receive a temperature-independent reference voltage.

5. The LDO regulator of claim 3, wherein the pre-regulation circuit further includes:
a first enable FET coupled to a power supply terminal of the operational amplifier and controlling an on/off state of the operational amplifier; and
a second enable FET coupled between ground and the pair of resistors.

6. The LDO regulator of claim 1, wherein the pass element is configured to:
receive the control signal at a control terminal of the pass element, and
generate an output voltage from a supply voltage when the voltage value of the control signal is higher than the voltage threshold of the pass element.

7. The LDO regulator of claim 6, wherein the pass element includes a field-effect transistor (FET), a gate electrode of the FET serving as the control terminal of the pass element, a first source/drain electrode of the FET being configured to receive the supply voltage, and a second source/drain electrode of the FET being configured to output the output voltage.

8. A regulation device, comprising:
a low dropout (LDO) regulator including:
a pre-regulation circuit configured to receive an LDO enable signal and generate a bias voltage;
a sustaining circuit coupled to the pre-regulation circuit, the sustaining circuit being configured to receive the bias voltage and a sustaining-circuit enable signal, and generate a control signal, the sustaining circuit being turned on or off by the sustaining-circuit enable signal; and
a pass element coupled to the sustaining circuit, the pass element being configured to receive the control signal,
wherein the sustaining circuit is further configured to:
generate, when the sustaining-circuit enable signal turns on the sustaining circuit, the control signal according to the bias voltage so that a voltage value of the control signal is higher than a voltage threshold of the pass element, and
maintain, when the sustaining-circuit enable signal turns off the sustaining circuit, the voltage value of the control signal above the voltage threshold of the pass element; and
a signal generation circuit coupled to the LDO regulator configured to generate a first periodic signal as the LDO enable signal and a second periodic signal as the sustaining-circuit enable signal.

9. The regulation device of claim 8, wherein the signal generation circuit is further configured such that:
a frequency of the first periodic signal is about the same as a frequency of the second periodic signal, and
the frequencies of the first periodic signal and the second periodic signal are temperature-dependent.

10. The regulation device of claim 9, wherein the signal generation circuit is further configured such that the frequencies of the first periodic signal and the second periodic signal are positively correlated to temperature.

11. The regulation device of claim 9, wherein the signal generation circuit is further configured such that each pulse of the first periodic signal rises earlier than a corresponding pulse of the second periodic signal in a same period.

12. The regulation device of claim 8, wherein the signal generation circuit includes:
a bandgap reference generator configured to generate a temperature-dependent current; and
a timing control circuit coupled to the bandgap reference generator, and configured to generate the first and second periodic signals based on the temperature-dependent current.

13. The regulation device of claim 12, wherein the bandgap reference generator further configured such that the temperature-dependent current is positively correlated to temperature.

14. The regulation device of claim 13, wherein the timing control circuit includes:
an oscillator configured to generate an oscillation signal having a frequency positively correlated to the temperature-dependent current; and
a pulse generator configured to generate the first and second periodic signals by truncating each pulse of the oscillation signal.

15. The regulation device of claim 13, wherein the signal generation circuit further includes:

a pump circuit coupled to the timing control circuit, and configured to generate a pump voltage to be applied to the pre-regulation circuit, based on the first periodic signal.

16. The regulation device of claim 8, wherein the pass element is configured to:

receive the control signal at a control terminal of the pass element, and generate an output voltage from a supply voltage when the voltage value of the control signal is higher than the voltage threshold of the pass element.

17. A method for driving a low dropout regulator in a memory circuit, comprising:

applying a selection signal to the memory circuit to put the memory circuit in a standby mode during a standby time;

detecting a temperature of the memory circuit;

generating an enable signal according to the temperature, a period of the enable signal being determined by the temperature and shorter than the standby time; and applying the enable signal to the low dropout regulator to periodically enable the low dropout regulator.

18. The method of claim 17, wherein generating the enable signal according to the temperature includes generating an enable signal having a period negatively correlated to the temperature.

19. The method of claim 18, wherein generating the enable signal having the period negatively correlated to the temperature includes:

generating a temperature-dependent current; and generating an enable signal having a period dependent upon the temperature-dependent current.

20. The method of claim 19, wherein generating the temperature-dependent current includes generating a current that is positively correlated to the temperature.

\* \* \* \* \*